United States Patent
Liu et al.

(10) Patent No.: US 8,319,306 B2
(45) Date of Patent: Nov. 27, 2012

(54) METHOD OF FABRICATING IMAGE SENSOR AND IMAGE SENSOR THEREOF

(75) Inventors: Han-Kang Liu, Tainan County (TW); Fang-Ming Huang, Grand Cayman (KY); Shao-Min Hung, Tainan County (TW); Bo-Nan Chen, Tainan County (TW)

(73) Assignees: Himax Technologies Limited, Fonghua Village, Xinshi Dist., Tainan (TW); Himax Imaging, Inc., Grand Cayman (KY)

( * ) Notice: Subject to any disclaimer, the term of this patent is extended or adjusted under 35 U.S.C. 154(b) by 196 days.

(21) Appl. No.: 12/698,073

(22) Filed: Feb. 1, 2010

(65) Prior Publication Data

US 2011/0186950 A1 Aug. 4, 2011

(51) Int. Cl.
*H01L 31/00* (2006.01)

(52) U.S. Cl. . 257/440; 257/294; 257/432; 257/E31.121; 257/E31.127

(58) Field of Classification Search .................. 257/290, 257/291, 294, 431, 432, 440, E31.11, E31.121, 257/E31.127; 359/619
See application file for complete search history.

(56) References Cited

U.S. PATENT DOCUMENTS

| | | | |
|---|---|---|---|
| 6,690,049 B2* | 2/2004 | Suzuki et al. | 257/294 |
| 7,068,432 B2* | 6/2006 | Boettiger et al. | 359/619 |
| 7,428,103 B2* | 9/2008 | Boettiger et al. | 359/619 |
| 7,884,436 B2* | 2/2011 | Mabuchi | 257/432 |
| 2005/0280012 A1* | 12/2005 | Boettiger et al. | 257/88 |
| 2008/0007839 A1* | 1/2008 | Deng et al. | 359/642 |
| 2009/0200623 A1* | 8/2009 | Qian et al. | 257/432 |

* cited by examiner

*Primary Examiner* — Eduardo A Rodela
(74) *Attorney, Agent, or Firm* — Winston Hsu; Scott Margo

(57) ABSTRACT

A method of fabricating an image sensor and an image sensor thereof are provided. The method comprises: providing a mask; utilizing the mask at a first position to form a first group of micro-lenses having a first height on a first group of color filters of a color filter array on a pixel array; shifting the mask from the first position to a second position, wherein a distance between the first position and the second position is substantially equal to a width of a pixel of the pixel array; and utilizing the mask at the second position to form a second group of micro-lenses having a second height, different from the first height, on a second group of color filters of the color filter array.

4 Claims, 7 Drawing Sheets

METHOD OF FABRICATING IMAGE SENSOR AND IMAGE SENSOR THEREOF

BACKGROUND OF THE INVENTION

1. Field of the Invention

The present invention relates to a method of fabricating an image sensor and an image sensor thereof, and more particularly, to a method of fabricating an image sensor and an image sensor comprising micro-lenses having different heights for improving quantum efficiency and avoiding cross talk.

2. Description of the Prior Art

Please refer to FIG. 1 and FIG. 2. FIG. 1 shows a top view of a conventional image sensor 100. FIG. 2 shows two schematic cross-sectional views of the image sensor 100 in FIG. 1. As shown in FIG. 1 and FIG. 2, the image sensor 100 comprises a pixel array 102, a color filter array 110, and a plurality of micro-lenses 120. The color filter array 110 is formed on the pixel array 102, and the micro-lenses 120 are formed on the color filter array 110. In other words, each micro-lens 120 is formed above a corresponding pixel of the pixel array 102. The micro-lenses 120 have the same height h. However, the image sensor 100 has cross talk problem due to the micro-lenses 120 having the same height h, and the quantum efficiency of the image sensor 100 is not good.

SUMMARY OF THE INVENTION

It is therefore one of the objectives of the present invention to provide a method of fabricating an image sensor and an image sensor comprising micro-lenses having different heights for improving quantum efficiency and avoiding cross talk, so as to solve the above problem.

According to an embodiment of the present invention, a method of fabricating an image sensor is disclosed. The method comprises: providing a mask; utilizing the mask at a first position to form a first group of micro-lenses having a first height on a first group of color filters of a color filter array on a pixel array; shifting the mask from the first position to a second position, wherein a distance between the first position and the second position is substantially equal to a width of a pixel of the pixel array; and utilizing the mask at the second position to form a second group of micro-lenses having a second height, different from the first height, on a second group of color filters of the color filter array.

According to an embodiment of the present invention, an image sensor is disclosed. The image sensor comprises: a pixel array, a color filter array, a first group of micro-lenses and a second group of micro-lens. The color filter array comprises a first group of color filters and a second group of color filters on the pixel array. The first group of micro-lenses has a first height on the first group of color filters. The second group of micro-lenses has a second height, different from the first height, on the second group of color filters.

Briefly summarized, the method of fabricating the image sensor and the image sensor of the present invention are capable of improving quantum efficiency and avoiding cross talk because the image sensor comprises micro-lenses having different heights.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ".

Figure 1:
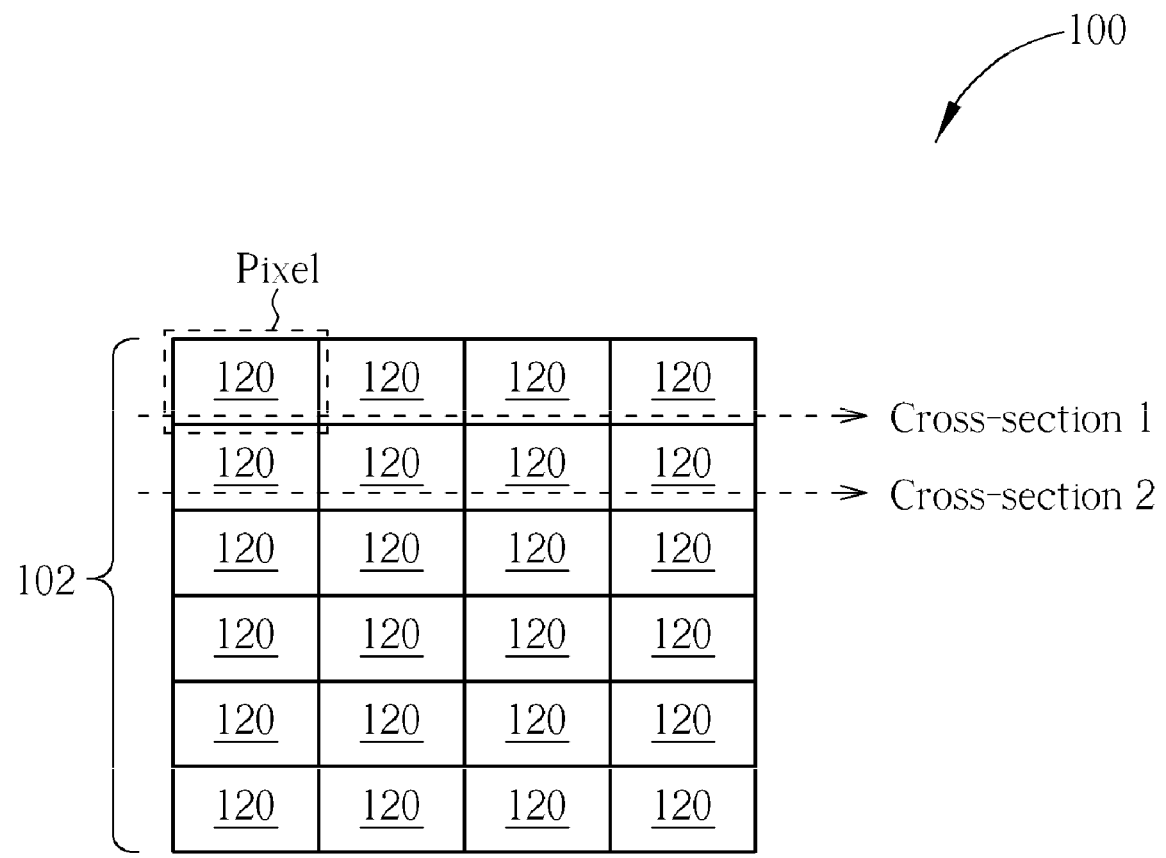
FIG. 1 shows a top view of a conventional image sensor.
Figure 2:
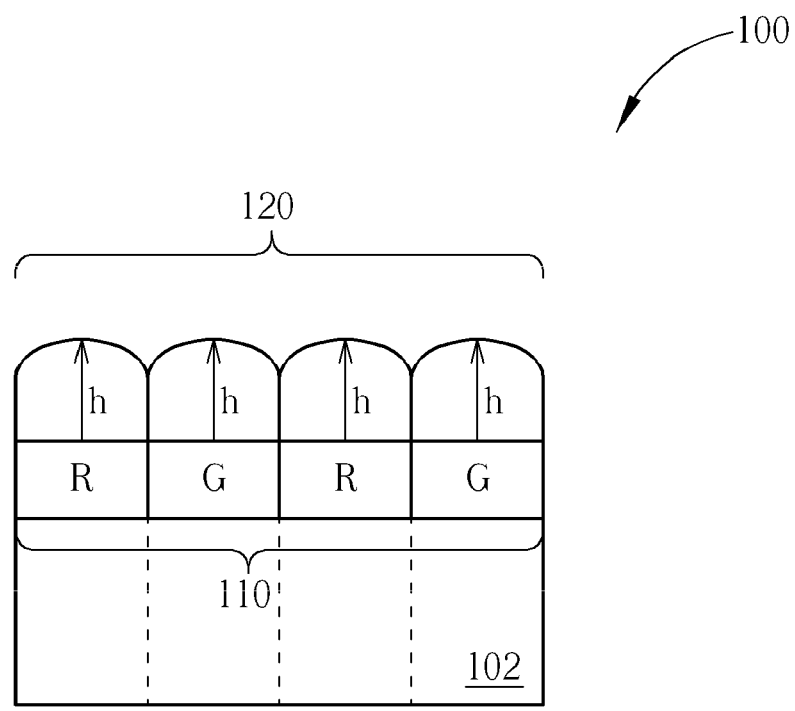
FIG. 2 shows two schematic cross-sectional views of the image sensor in FIG. 1.
Figure 2:
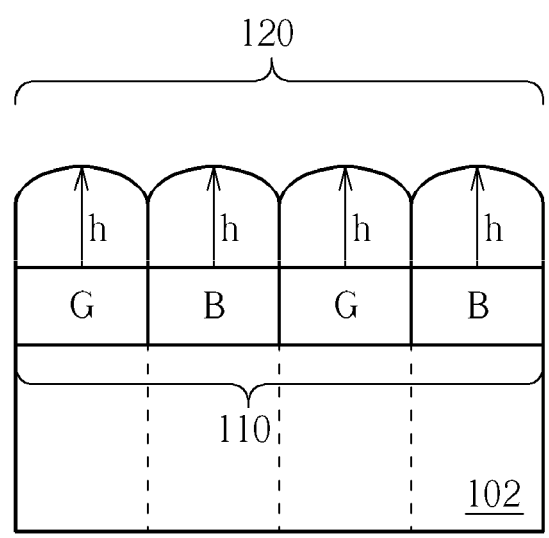
Figure 3:
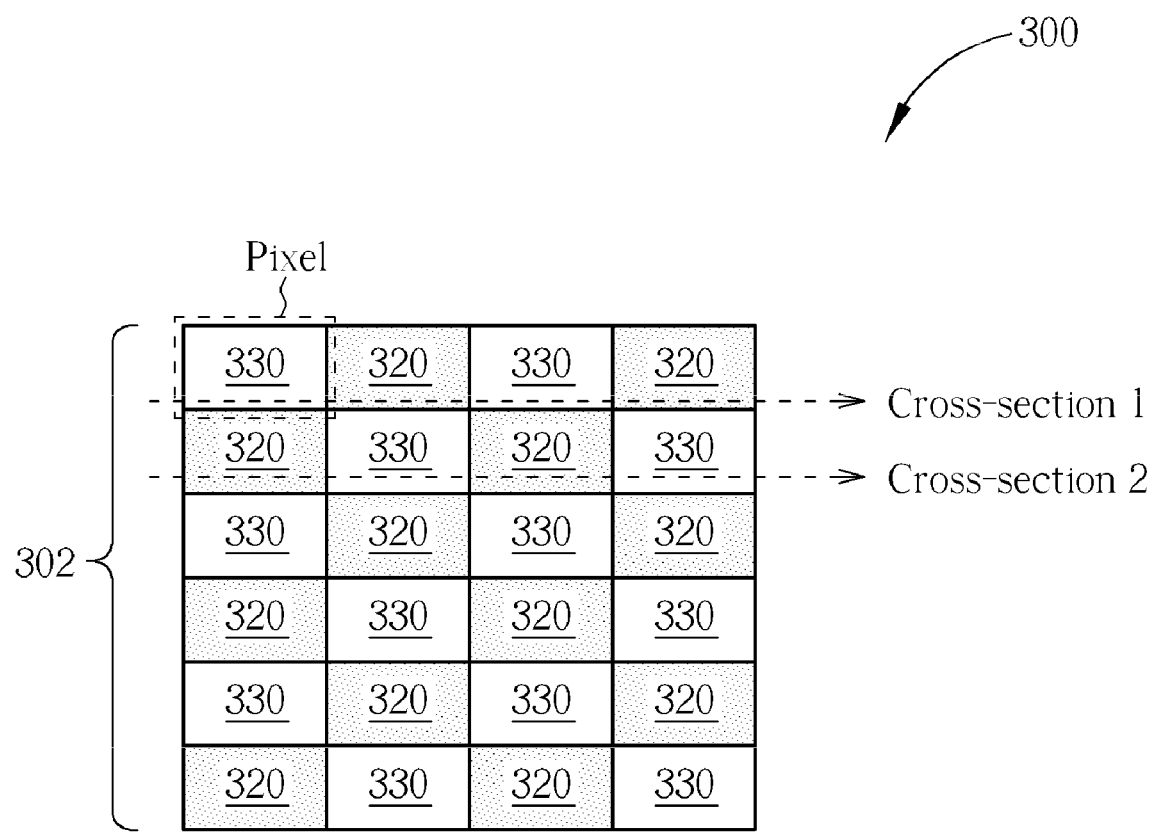
FIG. 3 shows a top view of an image sensor according to an embodiment of the present invention.
Figure 4:
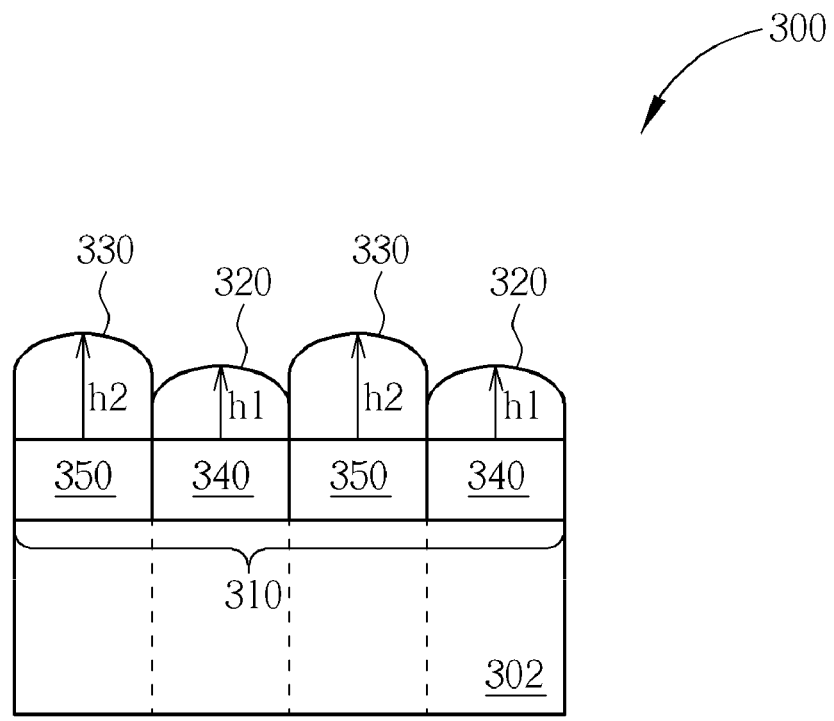
FIG. 4 shows two schematic cross-sectional views of the image sensor in FIG. 3.
Figure 4:
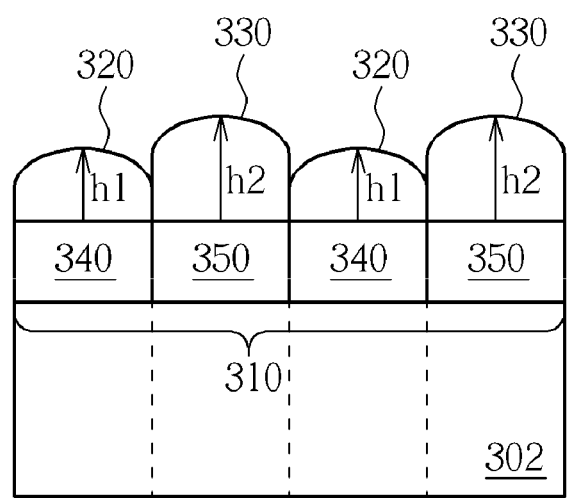

Please refer to FIG. 3 and FIG. 4. FIG. 3 shows a top view of an image sensor 300 according to an embodiment of the present invention. FIG. 4 shows two schematic cross-sectional views of the image sensor 300 in FIG. 3. The image sensor 300 can be a complementary metal-oxide semiconductor (CMOS) image sensor. As shown in FIG. 3 and FIG. 4, the image sensor 300 comprises a pixel array 302, a color filter array 310, a first group of micro-lenses 320 and a second group of micro-lenses 330. The color filter array 310 on the pixel array 302 comprises a first group of color filters 340 and a second group of color filters 350. The first group of micro-lenses 320 has a first height h1 on the first group of color filters 340. The second group of micro-lenses 330 has a second height h2 higher than the first height h1, on the second group of color filters 350.

In one embodiment, the first group of color filters 340 comprises a plurality of green monochromatic color filters, and the second group of color filters 350 comprises a plurality of red monochromatic color filters and a plurality of blue monochromatic color filters. In another embodiment, the second group of color filters 350 comprises a plurality of green monochromatic color filters, and the first group of color filters 340 comprises a plurality of red monochromatic color filters and a plurality of blue monochromatic color filters.

Figure 5:
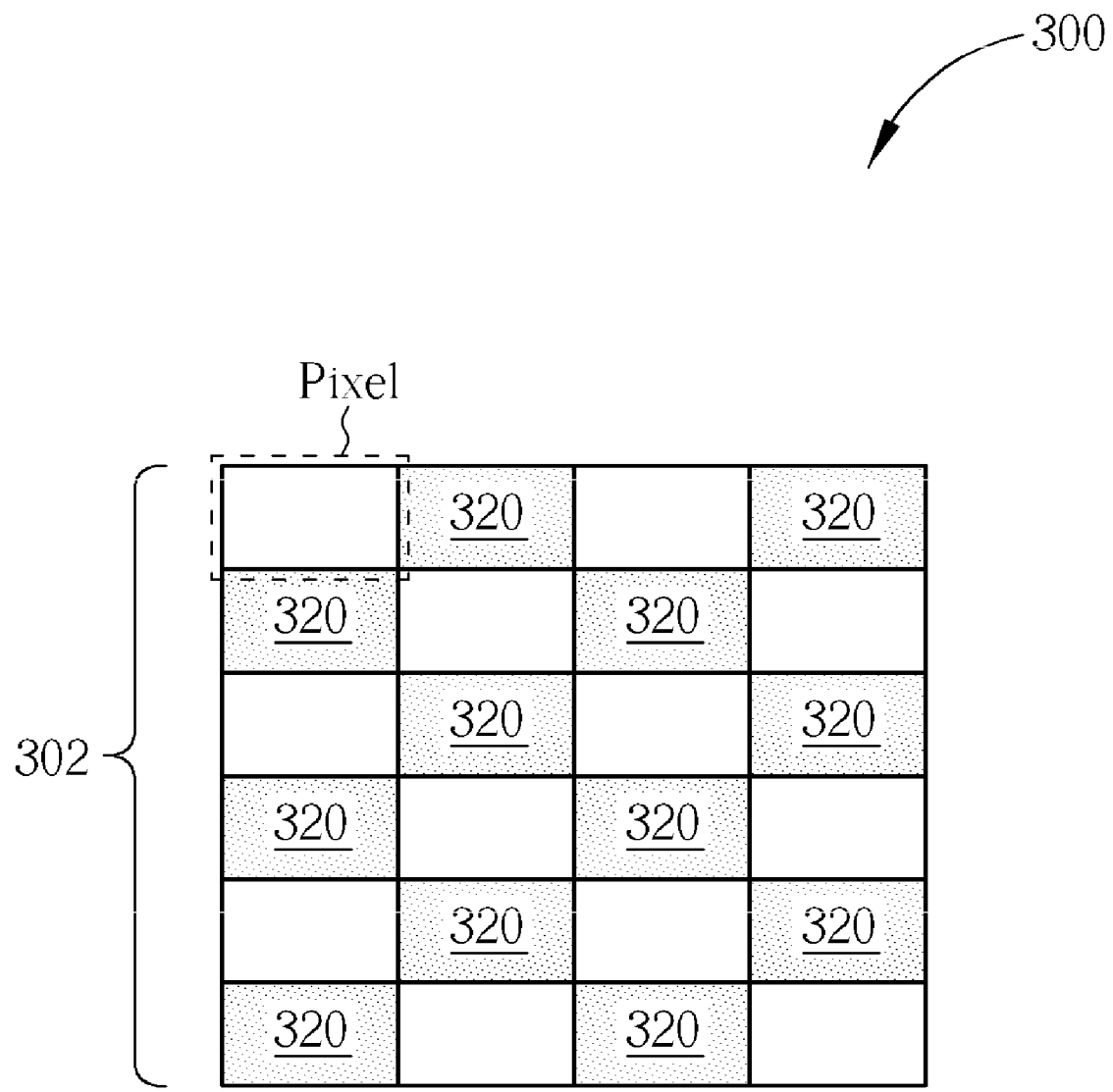
FIG. 5 shows utilizing a mask having a checkerboard pattern at a first position to form a first group of micro-lenses.
Figure 6:
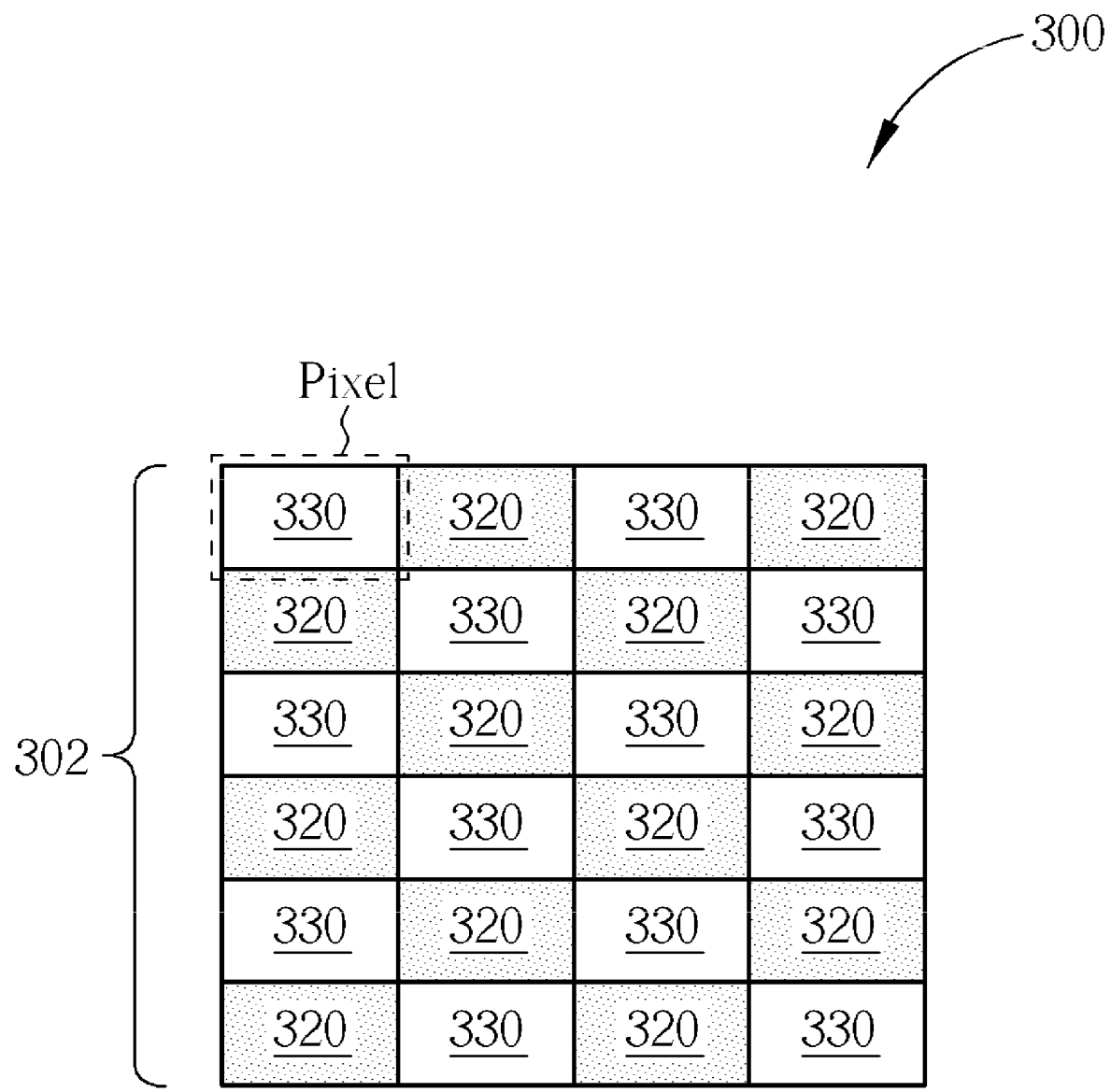
FIG. 6 shows utilizing the mask at a second position to form a second group of micro-lenses.

Additionally, the first group of color filters 340 and the second group of color filters 350 are arranged in a checkerboard pattern. The first group of micro-lenses 320 can be formed by utilizing a mask having the checkerboard pattern at a first position at first, as shown in FIG. 5. Next, the mask is shifted from the first position to a second position, wherein a distance between the first position and the second position is substantially equal to a width of a pixel of the pixel array 302, and the mask is utilized at the second position to form the second group of micro-lenses 330, as shown in FIG. 6.

Figure 7:
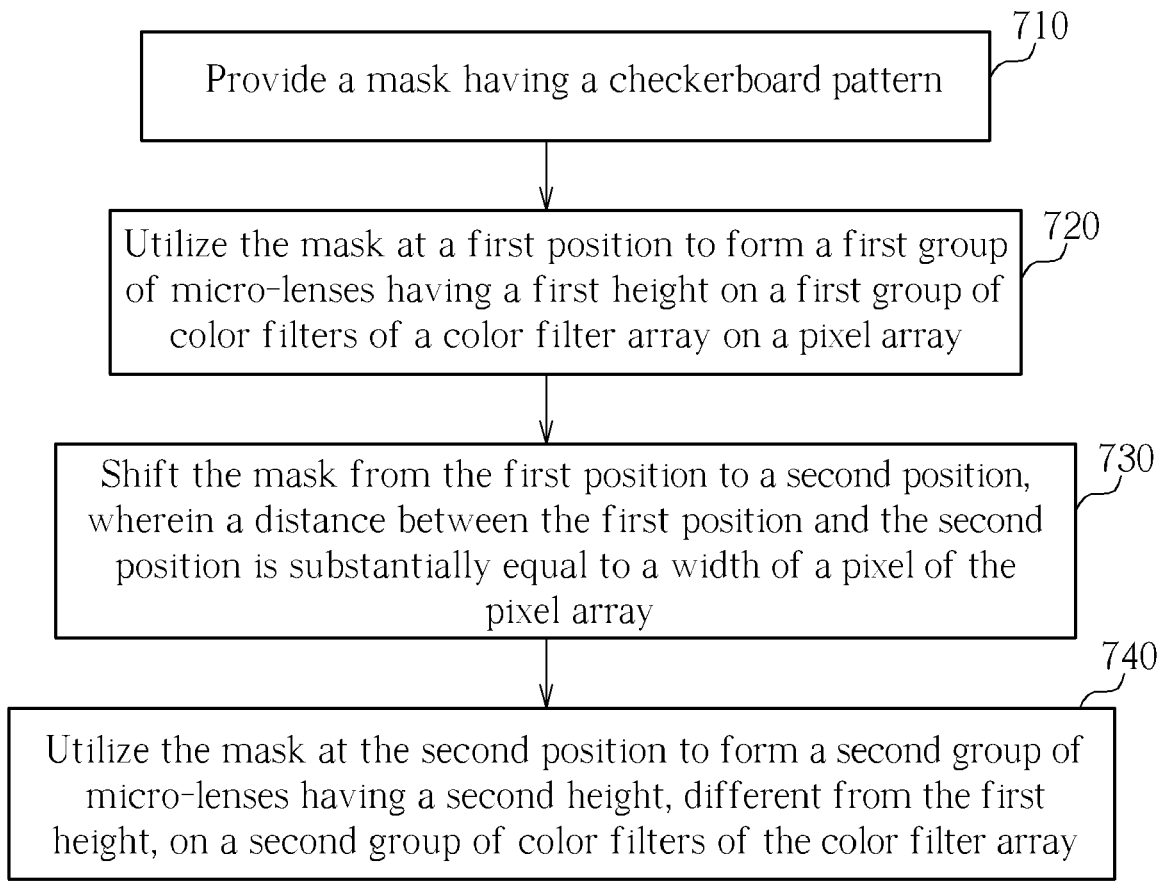
FIG. 7 is a flowchart showing a method of fabricating an image sensor in accordance with above embodiment of the present invention.

Please refer to FIG. 7. FIG. 7 is a flowchart showing a method of fabricating an image sensor in accordance with above embodiment of the present invention. Provided that substantially the same result is achieved, the steps of the process flowchart need not be in the exact order shown and need not be contiguous, that is, other steps can be intermediate. The method of the present invention comprises the following steps:

Step 710: Provide a mask having a checkerboard pattern.
Step 720: Utilize the mask at a first position to form a first group of micro-lenses having a first height on a first group of color filters of a color filter array on a pixel array.

Step 730: Shift the mask from the first position to a second position, wherein a distance between the first position and the second position is substantially equal to a width of a pixel of the pixel array.

Step 740: Utilize the mask at the second position to form a second group of micro-lenses having a second height, different from the first height, on a second group of color filters of the color filter array.

Briefly summarized, the method of fabricating the image sensor and the image sensor of the present invention are capable of improving quantum efficiency and avoiding cross talk because the image sensor comprises micro-lenses having different heights.

Those skilled in the art will readily observe that numerous modifications and alterations of the device and method may be made while retaining the teachings of the invention.

What is claimed is:

1. An image sensor, comprising:
    a pixel array;
    a color filter array, comprising a first group of color filters and a second group of color filters on the pixel array;
    a first group of micro-lens, having a first height on the first group of color filters; and
    a second group of micro-lens, having a second height, different from the first height, on the second group of color filters;
    wherein the first group of micro-lens and the second group of micro-lens are arranged in a checkerboard pattern.

2. The image sensor of claim 1, wherein the first group of color filters comprises a plurality of green monochromatic color filters, the second group of color filters comprises a plurality of red monochromatic color filters and a plurality of blue monochromatic color filters, and the second height is greater than the first height.

3. The image sensor of claim 1, wherein the first group of color filters comprises a plurality of green monochromatic color filters, the second group of color filters comprises a plurality of red monochromatic color filters and a plurality of blue monochromatic color filters, and the first height is greater than the second height.

4. The image sensor of claim 1, wherein the image sensor is a complementary metal-oxide semiconductor (CMOS) image sensor.

\* \* \* \* \*